(12) United States Patent
Kazakevich et al.

(10) Patent No.: US 6,934,344 B2
(45) Date of Patent: Aug. 23, 2005

(54) DIGITAL AUTOMATIC GAIN CONTROL

(75) Inventors: Leonid Kazakevich, Plainview, NY (US); Fatih Ozluturk, Port Washington, NY (US)

(73) Assignee: Interdigital Technology Corporation, Wilmington, DE (US)

( * ) Notice: Subject to any disclaimer, the term of this patent is extended or adjusted under 35 U.S.C. 154(b) by 763 days.

(21) Appl. No.: 09/817,455

(22) Filed: Mar. 26, 2001

(65) Prior Publication Data

US 2002/0012409 A1 Jan. 31, 2002

Related U.S. Application Data

(60) Provisional application No. 60/192,289, filed on Mar. 27, 2000.

(51) Int. Cl.[7] .............................. H04L 27/08; H04L 6/12; H04L 27/06
(52) U.S. Cl. ......................... 375/345; 375/261; 375/340
(58) Field of Search ........................ 375/345, 261–322, 375/340

(56) References Cited

U.S. PATENT DOCUMENTS

| 4,188,587 A | | 2/1980 | Palmer |
|---|---|---|---|
| 4,193,034 A | | 3/1980 | Vance |
| 4,785,418 A | * | 11/1988 | Pearce et al. ............... 708/200 |
| 5,533,064 A | * | 7/1996 | Ichihara ...................... 375/340 |
| 5,771,263 A | | 6/1998 | Kanazawa et al. |
| 5,818,875 A | * | 10/1998 | Suzuki et al. ............... 375/261 |
| 5,852,772 A | | 12/1998 | Lampe et al. |
| 6,002,300 A | * | 12/1999 | Herbster et al. ............ 330/149 |
| 6,195,396 B1 | | 2/2001 | Fang et al. |
| 6,195,399 B1 | * | 2/2001 | Dent et al. .................. 375/322 |

* cited by examiner

*Primary Examiner*—Stephen Chin
*Assistant Examiner*—Cicely Ware
(74) *Attorney, Agent, or Firm*—Volpe and Koenig, P.C.

(57) ABSTRACT

A system for automatic gain control prevents input overload by precisely controlling the input level of a received, digitally modulated signal without using a variable gain amplifier. A limiting amplifier in conjunction with a logarithmic detector splits an input signal path in two, providing separate phase and amplitude information for downstream digital signal processing, where the separate phase and amplitude information is processed without variable gain artifacts. The separated phase information may further be divided into I and Q signals.

4 Claims, 2 Drawing Sheets

DIGITAL AUTOMATIC GAIN CONTROL

This application claims priority from provisional application Ser. No. 60/192,289, filed Mar. 27, 2000.

BACKGROUND OF THE INVENTION

1. Field of the Invention

The present invention relates generally to wireless digital communication. More specifically, the invention relates to a system and method for controlling the gain of a received communication signal in the digital domain.

2. Description of the Prior Art

A digital communication system typically transmits information or data using a continuous frequency carrier with modulation techniques that vary its amplitude, frequency or phase. The information to be transmitted is input in the form of a bit stream which is mapped onto a predetermined constellation that defines the modulation scheme. The mapping of the bit stream onto a plurality of symbols is referred to as modulation. Each symbol transmitted in a symbol duration represents a unique waveform. The symbol rate or simply the rate of the system is the rate at which symbols are transmitted over the communication channel.

Today, the most commonly used method for modulating data signals is quadrature amplitude modulation (QAM), which varies a predefined carrier frequency amplitude and phase according to an input signal. Other modulation techniques such as frequency modulation (FM), frequency shift keying (FSK), phase shift keying (PSK), binary phase shift keying (BPSK) contain little or no amplitude information when compared with the many types of QAM (64 QAM, 256 QAM, etc.) and quadrature phase shift keying(QPSK) which use the available bandwidth more efficiently by including amplitude information as part of the modulation.

QPSK and QAM techniques have information coded in both the phase and amplitude variations. In order to recover the amplitude modulated information accurately, the communication system receiver must have a linear response within the input signal range of the analog-to-digital converter (ADC) used to convert the received information, whether radio frequencies, intermediate frequencies or baseband frequencies, into a digital signal output for downstream digital signal processing. The dynamic range of the input signal at the antenna port may be very large. For example, in $3^{rd}$ generation wireless protocols, the input signal dynamic range may exceed 70 dB.

A prior art technique for demodulating amplitude modulated signals is the use of a linear demodulator comprising an I and Q demodulator in conjunction with an automatic gain control (AGC) circuit to keep the input signal within the input range of the demodulator and/or within the input range of ADCs (analog to digital converters). An AGC circuit keeps an output within a linear operating region by adjusting the gain of an amplifier via feedback. Such a prior art AGC circuit 8 is shown in FIG. 1. The AGC comprises a voltage or current variable gain amplifier 10, a power computation processor 12 and a comparison circuit 14.

A signal input 16 to the AGC circuit 8 is coupled to the variable gain amplifier 10. The output power 18 is measured by the power computation processor 12 which produces an average or peak power measurement. The measured power is compared with a predefined value in the comparison circuit 14 which generates an error signal 20 corresponding to the difference in power level. The error signal 20 acts as negative feedback and controls the gain of the variable gain amplifier 10. In response to the error signal 20, the variable gain amplifier 10 controls the magnitude of the output signal 18 with reference to the input signal 16. The AGC circuit 8 maintains the output signal 18 within the linear operating region of the receiver and ADCs (not shown) employed to convert the analog signal to digital form.

While AGCs obviate input overloads, the individual components within the AGC circuit contribute their own distortions. The variable gain amplifier used in prior art AGC circuits is not ideal and suffers from a plurality of problems when reducing the amplifier design to a physical system. Problems such as amplifier dynamic range, linearity, noise figure vs. gain, input/output compression, constant phase vs. control signal, temperature stability, repeatability and others present a myriad of problems for a designer.

U.S. Pat. No. 5,533,064 discloses a digital radio receiver. An amplifier limiter receives an input and uses a plurality of limiting amplifiers to produce a constant amplitude signal. Using taps between the plurality of amplifiers, detectors are used to determine a log value of the input. A low pass filter removes harmonics from the constant amplitude signal. An orthogonal detector produces I and Q components of the constant amplitude signal. The I and Q components are converted to digital values. The log value is delayed and converted to a digital value. Using a log to linear converter the log value is converted into a digital value which is multiplied with the I and Q digital values respectively.

Impairments in the variable gain amplifier performance manifest themselves at the system level. Since the AGC circuit is usually a closed loop control system, any open loop gain variation in the design, such as nonlinearity, dynamic range, noise, etc., will reduce performance and cause instability downstream. Additionally, since an AGC circuit relies upon negative feedback, system speed is important, requiring a constant insertion phase.

Accordingly, there exists a need for a system and method that allows for precise AGC without the design limitations imposed by variable gain amplifiers and other components utilized in the prior art.

SUMMARY OF INVENTION

The present invention is a system for automatic gain control that prevents input overload by precisely controlling the input level of a received signal without relying upon variable gain amplifiers or the like for gain adjustment. A limiting amplifier in conjunction with a logarithmic detector splits an input signal path in two, providing separate phase and amplitude information to downstream digital signal processing units where the separate phase and amplitude information is processed without variable gain artifacts.

Objects and advantages of the system and method will become apparent to those skilled in the art after reading the detailed description of the preferred embodiment.

DETAILED DESCRIPTION OF THE INVENTION

Figure 1:
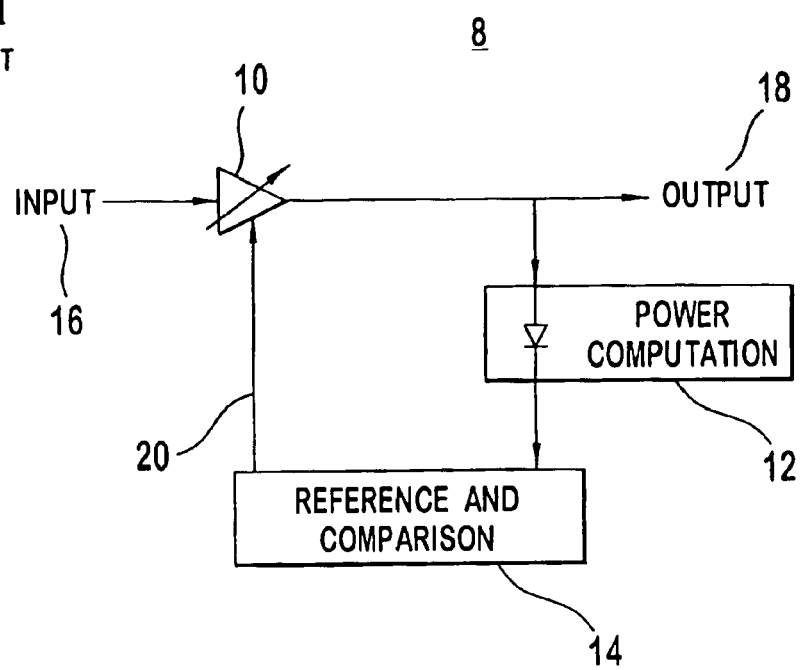
FIG. 1 is a prior art automatic gain control system.

The embodiments will be described with reference to the drawing figures where like numerals represent like elements throughout.

Figure 2:
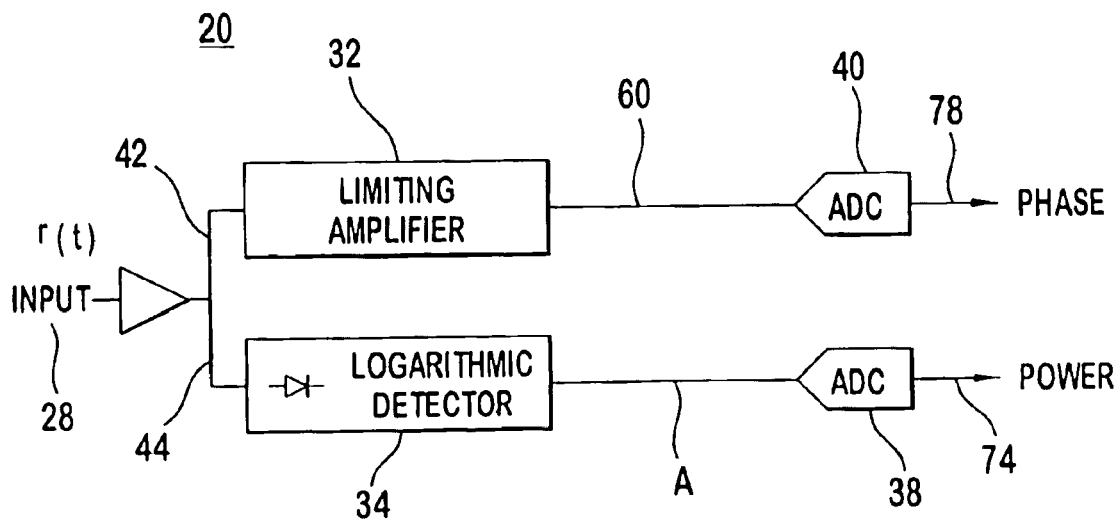
FIG. 2 is a system diagram of the present invention.

Shown in FIG. 2 is a digital automatic gain control AGC circuit 20 of the present invention. A digitally modulated signal r(t) is received from a communication channel (not shown) and is input to a receiver. One skilled in the art recognizes that additional conversion means may exist before the AGC input 28 to convert the energy used during wireless transmission to a form which is capable of being processed by the circuitry 20 of FIG. 2. Such additional conversion means are beyond the scope of this disclosure. The received, modulated signal r(t) contains amplitude and phase (frequency) information and is coupled to a limiting amplifier 32 for processing phase (frequency) components 42 and to a logarithmic detector 34 for processing amplitude components 44.

The logarithmic detector 34 has a predefined dynamic range as required for the particular communication system and a response time faster than one unit of transmitted information. The received signal r(t) information structure may be a chip, a bit, a symbol or the like. The output of the logarithmic detector 34 which comprises amplitude information A is defined as:

$$A = 10 \log_{10}(P_{in}) \qquad \text{Equation 1}$$

where $P_{in}$, is the received signal r(t) input power at the AGC input 28. $P_{in}$ is defined as:

$$P_{in} = (i(t))^2 + (q(t))^2 \qquad \text{Equation 2}$$

where i(t) denotes the real part of a complex number x, and q(t) denotes the imaginary part of the complex number x.

The amplitude information A from the logarithmic detector 34 is an analog representation of the power of the received signal r(t) at time t. The amplitude information A is coupled to an ADC 38 for conversion to a digital signal 74 for further downstream digital signal processing. For example, a 10 bit resolution ADC having a 0.1 dB step will allow an input dynamic range of:

$$\begin{aligned} D &= 0.1 \, ((2)^{10} - 1) \qquad \text{Equation 3}\\ &= 0.1 \, (1023)\\ &= 102.3 \, \text{dB}. \end{aligned}$$

For the phase (frequency) components 42 of the received signal r(t) input into the limiting amplifier 32, the output of the limiting amplifier 32 is either a positive or negative 1 (+1, −1) value representing relative phase, the pulse length of the positive and negative pulses representing phase information. The phase information 60, after undergoing demodulation as is set forth below, may be converted to digital signals using ADC's for further downstream signal processing. The ADC 40 is selected to have a very high sampling rate which is preferably the order of one or more orders of magnitude of the bandwidth (BW) of the input, for example 100×(BW), to provide phase information 70 in digital form.

Figure 3:
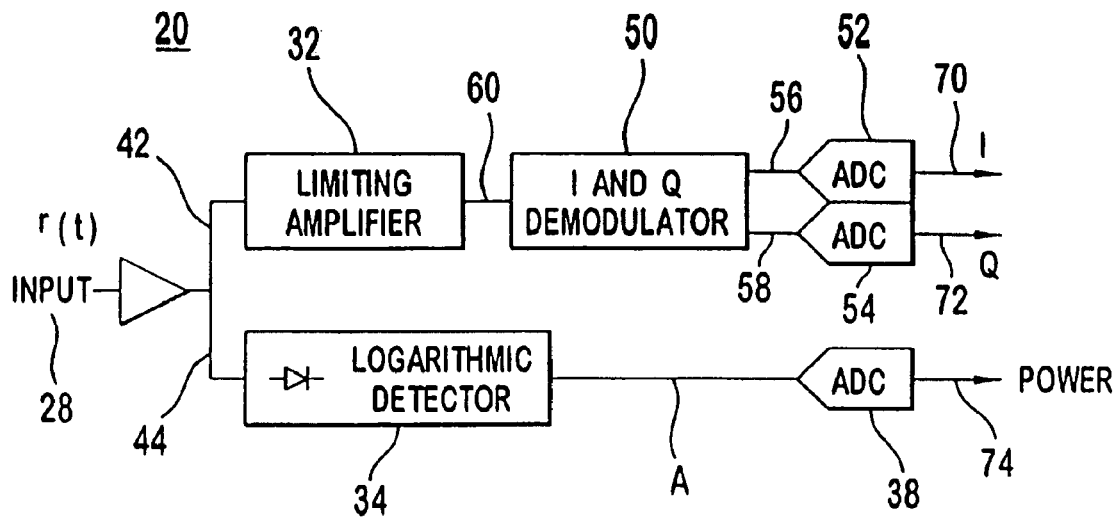
FIG. 3 is another embodiment of the present invention.
Figure 4:
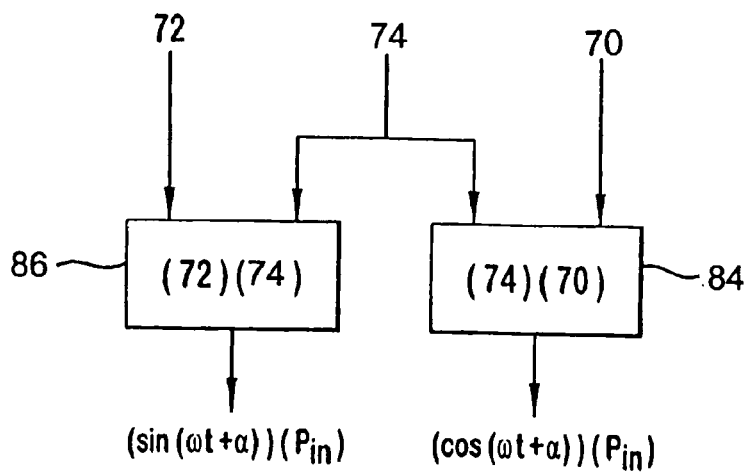
FIG. 4 is a simplified diagram showing the manipulation of the phase and amplitude information in the digital domain.

As shown in FIG. 3, the phase information 60 undergoes I and Q demodulation using an I and Q demodulator 50 and a local oscillator (not shown). After I and Q demodulation, the output signals 56, 58 respectively, are:

$$id(t) = C \sin(\omega\pi + \alpha), \text{ and} \qquad \text{Equation 4}$$

$$qd(t) = C \cos(wt + \alpha) \qquad \text{Equation 5}$$

where C is a constant and does not vary with input signal r(t) power variation. Each signal component id(t) 56 and qd(t) 58 is an analog value representing the signal component value of phase which varies between −1 and +1. This phase information 56, 58 is similarly digitized producing digital signals 70,72 for further downstream signal processing using an I ADC 52 and a Q ADC 54, each ADC having a low resolution, since the amplitude variation of each signal component is minimal.

After digitization at 74, the amplitude information A is converted back to a signal having a linear format (from the log):

$$P_{in} = 10^{(a/10)} \qquad \text{Equation 6}$$

and is multiplied by the digitized frequency information id(t) 70 and qd(t) 72. The result is:

$$\begin{aligned} i(t) &= id(t)(P_{in}) \qquad \text{Equation 7}\\ &= \sin(\omega t + \alpha)[(i(t))^2 + (q(t))^2] \text{ and} \end{aligned}$$

$$\begin{aligned} q(t) &= qd(t)(P_{in}) \qquad \text{Equation 8}\\ &= \cos(\omega t + \alpha)[(i(t))^2 + (q(t))^2]. \end{aligned}$$

Accordingly, this process yields the original signal 42, 44 input into the limiting amplifier 32 and the logarithmic detector 34. FIG. 3 shows a simplified flow diagram, for digital manipulation of the outputs 70, 72 and 74 to obtain the original signals. The digital information 72 and 74 are respectively multiplied by the digital output of step 82 at steps 84, 86 to yield the result shown by Equation 7. Further manipulations in the digital domain may be performed to obtain the real and imaginary components shown in Equation 7 and 8. As described herein, the individual components are manipulated in the digital domain without the distortion artifacts imposed by prior art AGC circuits. The AGC signal is extracted in digital form and is typically comprised of a number of most significant binary bits commensurate with the resolution desired. Typically four (4) to six (6) bits is sufficient although a greater number of the most significant bits up to the full dynamic range may be extracted depending on the needs of the particular application.

While the present invention has been described in terms of the preferred embodiments, other variations which are within the scope of the invention as outlined in the claims below will be apparent to those skilled in the art.

What is claimed is:

1. An automatic gain controller operating on a quadrature modulated communication signal having amplitude modulated and phase modulated components, comprising: a logarithmic detector providing logs of amplitudes of the quadrature modulated signal and a first analog to digital converter for converting the logs of the amplitudes of the quadrature modulated signal into digital values of the logs; the controller characterized by comprising:

a limiting amplifier receiving the quadrature modulated communication signal and limiting the quadrature modulated communication signal to produce an output signal;

an I and Q demodulator for demodulating the output signal produced by the limiting amplifier into I and Q components;

an I analog to digital converter for converting the demodulated I components into digital values of the I components representing chase information of an I portion of the quadrature modulated signal; and a Q analog to digital converter for converting the demodulated Q components into digital values of the Q component representing phase information of a Q portion of the quadrature modulated signal.

2. The automatic gain controller of claim 1 further characterized by the logarithmic detector has a response time faster than 1 unit of transmitted information which is one of a chip, a bit and a symbol.

3. The controller of claim 1 further characterized by comprising a second analog to digital converter coupled to the limiting amplifier has a sampling rate to provide digital conversion of the phase information.

4. The controller of claim 1 further characterized by multiplying the digital values of the I components with the digital value of the logs and multiplying the digital values of the Q components with the digital value of the logs.

* * * * *

UNITED STATES PATENT AND TRADEMARK OFFICE
CERTIFICATE OF CORRECTION

PATENT NO.     : 6,934,344 B2
DATED          : August 23, 2005
INVENTOR(S)    : Kazakevich et al.

It is certified that error appears in the above-identified patent and that said Letters Patent is hereby corrected as shown below:

Column 3,
Line 13, after the words "and to", delete "alogarithmic" and insert therefor
-- a logarithmic --.
Line 59, delete "land" and insert therefor -- I and --.
Line 62, delete "id(t)=C sin($\omega\pi+\alpha$), and" and insert therefor -- id(t)=C sin($\omega\tau+\alpha$), and --.

Column 4,
Line 12, delete "$P_{in}=10^{(a/10)}$" and insert therefor -- $P_{in}=10^{(A/10)}$ --.
Line 64, after the word "representing", delete "chase", and insert therefor -- phase --.

Signed and Sealed this

Twenty-second Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,934,344 B2
APPLICATION NO. : 09/817455
DATED : August 23, 2005
INVENTOR(S) : Kazakevich et al.

Page 1 of 1

It is certified that error appears in the above-identified patent and that said Letters Patent is hereby corrected as shown below:

<u>Column 3,</u>
Line 13, after the words "and to", delete "alogarithmic" and insert therefor
-- a logarithmic --.
Line 59, delete "land" and insert therefor -- I and --.
Line 62, delete "id(t)=C sin($\omega\pi$+$\alpha$), and" and insert therefor -- id(t)=C sin($\omega$t+$\alpha$), and --.

<u>Column 4,</u>
Line 12, delete "$P_{in}=10^{(a/10)}$" and insert therefor -- $P_{in}=10^{(A/10)}$ --.
Line 64, after the word "representing", delete "chase" and insert therefor -- phase --.

This certificate supersedes the Certificate of Correction issued November 22, 2005.

Signed and Sealed this

Fourteenth Day of July, 2009

JOHN DOLL
*Acting Director of the United States Patent and Trademark Office*